(12) United States Patent
Zhu et al.

(10) Patent No.: US 12,356,827 B2
(45) Date of Patent: Jul. 8, 2025

(54) DISPLAY SUBSTRATE COMPRISING SMALL HOLES FILLED WITH COLOR FILTER MATERIALS AND PREPARATION METHOD THEREFOR, AND DISPLAY APPARATUS

(71) Applicant: BOE Technology Group Co., Ltd., Beijing (CN)

(72) Inventors: Wenxiu Zhu, Beijing (CN); Hualing Yang, Beijing (CN); Bo Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 551 days.

(21) Appl. No.: 17/786,563

(22) PCT Filed: Sep. 2, 2021

(86) PCT No.: PCT/CN2021/116301
§ 371 (c)(1),
(2) Date: Jun. 17, 2022

(87) PCT Pub. No.: WO2022/083310
PCT Pub. Date: Apr. 28, 2022

(65) Prior Publication Data
US 2023/0015554 A1    Jan. 19, 2023

(30) Foreign Application Priority Data
Oct. 20, 2020  (CN) .......................... 202011125441.6

(51) Int. Cl.
*H10K 59/40*    (2023.01)
*H10K 50/86*    (2023.01)
(Continued)

(52) U.S. Cl.
CPC ............ *H10K 59/40* (2023.02); *H10K 50/865* (2023.02); *H10K 59/12* (2023.02); *H10K 59/353* (2023.02);
(Continued)

(58) Field of Classification Search
CPC .. H10K 59/353; H10K 59/352; H10K 50/865; H10K 59/8792; H10K 59/38; H10K 59/65; H10K 59/40; H10K 59/60
See application file for complete search history.

(56) References Cited

U.S. PATENT DOCUMENTS

2017/0250377 A1    8/2017  Tokuda
2020/0327296 A1   10/2020  Wu et al.
(Continued)

FOREIGN PATENT DOCUMENTS

CN    107819023 A    3/2018
CN    110187544 A    8/2019
(Continued)

OTHER PUBLICATIONS

International Search Report for PCT/CN2021/116301 Mailed Nov. 25, 2021.
(Continued)

*Primary Examiner* — Nduka E Ojeh
(74) *Attorney, Agent, or Firm* — Ling Wu; Stephen Yang; Ling and Yang Intellectual Property

(57) ABSTRACT

A display substrate and a preparation method therefor, and a display apparatus. The display substrate includes multiple pixel units each including multiple sub-pixels, the multiple sub-pixels includes first color sub-pixels. Each sub-pixel includes a color filter structure layer, the color filter structure layer includes a black matrix defining a pixel opening, and a color filter unit covering the pixel opening. The display substrate includes a first display region and a second display region
(Continued)

region on the periphery of the first display region. A black matrix in the first display region has small holes which are filled with light filtering units, and the material of the light filtering units is same as the material of the color filter units of the first color sub-pixels. The area of the first color sub-pixels in the first display region is less than the area of the first color sub-pixels in the second display region.

16 Claims, 6 Drawing Sheets

(51) Int. Cl.
  *H10K 59/12* (2023.01)
  *H10K 59/35* (2023.01)
  *H10K 59/38* (2023.01)
  *H10K 59/65* (2023.01)
  *H10K 59/80* (2023.01)
(52) U.S. Cl.
  CPC ............ *H10K 59/38* (2023.02); *H10K 59/65* (2023.02); *H10K 59/8792* (2023.02)

(56) References Cited

U.S. PATENT DOCUMENTS

| | | | | |
|---|---|---|---|---|
| 2021/0066669 | A1* | 3/2021 | Kubota | H10K 59/65 |
| 2021/0134242 | A1* | 5/2021 | Hei | G09G 5/02 |
| 2021/0280569 | A1* | 9/2021 | You | H01L 25/18 |
| 2021/0376003 | A1 | 12/2021 | Xu et al. | |
| 2021/0397806 | A1* | 12/2021 | Lu | H10K 59/8792 |
| 2022/0067340 | A1* | 3/2022 | Han | H10K 59/38 |
| 2023/0096260 | A1* | 3/2023 | Zhang | G02F 1/134309 257/40 |
| 2023/0225170 | A1* | 7/2023 | Sun | H10K 59/352 257/40 |

FOREIGN PATENT DOCUMENTS

| | | |
|---|---|---|
| CN | 111312792 A | 6/2020 |
| CN | 111599846 A | 8/2020 |
| CN | 112259584 A | 1/2021 |

OTHER PUBLICATIONS

First Office Action dated Jun. 3, 2023 for Chinese Patent Application No. 202011125441.6 and English Translation.

* cited by examiner

DISPLAY SUBSTRATE COMPRISING SMALL HOLES FILLED WITH COLOR FILTER MATERIALS AND PREPARATION METHOD THEREFOR, AND DISPLAY APPARATUS

CROSS-REFERENCE TO RELATED APPLICATIONS

The present application is a continuation application of International PCT Application No. PCT/CN2021/116301, having an international filing date of Sep. 2, 2021, which claims priority of Chinese Patent Application No. 202011125441.6 filed with the CNIPA on Oct. 20, 2020 and entitled "Display Substrate and Preparation Method Therefor, and Display Apparatus", the contents of which should be construed as being incorporated into the present application by reference.

TECHNICAL FIELD

Embodiments of the present disclosure relate to, but are not limited to, the field of display technologies, and in particular to a display substrate, a method for preparing the display substrate and a display Apparatus.

BACKGROUND

Organic Light Emitting Diodes (OLEDs), which are active light emitting display devices, have advantages such as auto-luminescence, wide view angle, high contrast, low power consumption, extremely high response speed, etc. With the continuous development of display technology, an OLED technology has been applied to flexible display devices increasingly.

In order to make the flexible display devices lighter and thinner and easier to bend or fold, one scheme is to apply a color filter (CF) with a thickness of less than 10 microns in place of a polarizer (POL) to a display panel, that is, a CF on Encapsulation (COE) technology is used. In an optical fingerprint identification structure of a display device based on the COE technology, small holes filled with color filter materials, are provided in a black matrix (BM). Light reflected by a finger is imaged on an optical sensor by the pinhole imaging principle, thereby further implementing fingerprint identification.

SUMMARY

The following is a summary of subject matters described herein in detail. The summary is not intended to limit the protection scope of the claims.

An embodiment of the present disclosure provides a display substrate including a baseplate and multiple pixel units arranged on the baseplate, wherein a pixel unit includes multiple sub-pixels, the multiple sub-pixels includes a first color sub-pixel, at least one of the sub-pixels includes a color film structure layer, the color film structure layer includes a black matrix defining a pixel opening and a color film unit covering the pixel opening, the display substrate includes a first display region and a second display region located at a periphery of the first display region, and a small hole, which is filled with a filter unit, is provided on the black matrix in the first display region, a material of the filter unit is the same as a material of the color film unit of the first color sub-pixel, and an area of a first color sub-pixel in the first display region is less than an area of a first color sub-pixel in the second display region.

In some exemplary embodiments, multiple first display regions are provided, and each first display region includes at least one small hole.

In some exemplary embodiments, light filtered out by the filter unit is green light, and the first color sub-pixel is a green light sub-pixel.

In some exemplary embodiments, the area of the first color sub-pixel in the first display region is proportional directly to a distance between a pixel luminance center of a pixel unit where the first color sub-pixel is located and a center of the small hole, the pixel luminance center is a position which is located on a line connecting a pixel center of a red light sub-pixel and a pixel center of a green light sub-pixel and is at 30% of a distance from the pixel center of the green light sub-pixel.

In some exemplary embodiments, the multiple sub-pixels further includes a second color sub-pixel and a third color sub-pixel, the second color sub-pixel is a blue light sub-pixel, the third color sub-pixel is a red light sub-pixel, an area of a second color sub-pixel in the first display region is equal to an area of a second color sub-pixel in the second display region, and an area of a third color sub-pixel in the first display region is equal to an area of a third color sub-pixel in the second display region.

In some exemplary embodiments, two first color sub-pixels form a set of first color the sub-pixels, and in a plane parallel to the baseplate, sets of the first color sub-pixels are arranged in multiple columns, the second color sub-pixels are arranged in multiple columns, the third color sub-pixels are arranged in multiple columns, any three adjacent columns of sub-pixels include a column of sets of first color sub-pixels, a column of second color sub-pixels and a column of third color sub-pixels, the sets of the first color sub-pixels in the column of the sets of first color sub-pixels and the second color sub-pixels and the third color sub-pixels in the adjacent columns are arranged in a staggered manner, the two first color sub-pixels of the set of the first color sub-pixels are arranged at intervals along a direction of the column, and a first color sub-pixel and an adjacent second color sub-pixel and an adjacent third color sub-pixel in the column of the second color sub-pixels and the column of the third color sub-pixels which are adjacent to the column of the sets of the first color sub-pixels form a pixel unit.

In some exemplary embodiments, in the plane parallel to the baseplate and in a direction perpendicular to the column, a width of the second color sub-pixel is greater than a width of the first color sub-pixel, and the width of the first color sub-pixel is greater than a width of the third color sub-pixel.

In some exemplary embodiments, the small hole is arranged in the column of the third color sub-pixels, and is located between two adjacent third color sub-pixels and close to an end of one of the two third color sub-pixels, the first display region includes a first pixel unit, a second pixel unit and a third pixel unit, wherein the first pixel unit is a pixel unit in which a first color sub-pixel relatively close to the small hole in a set of first color sub-pixels close to the small hole in a column of sets of first color sub-pixels adjacent to the small hole is located, the second pixel unit is a pixel unit in which a first color sub-pixel relatively away from the small hole in the set of the first color sub-pixels close to the small hole is located, and the third pixel unit is a pixel unit in which a second color sub-pixel close to the small hole in a column of second color sub-pixels adjacent to the small hole is located and the first color sub-pixel is close to the small hole.

In some exemplary embodiments, the small hole is arranged in the column of the second color sub-pixels, and is located between two adjacent second color sub-pixels and close to an end of one of the two second color sub-pixels, the first display region includes a first pixel unit, a second pixel unit and a third pixel unit, wherein the first pixel unit is a pixel unit in which a first color sub-pixel relatively close to the small hole in a set of first color sub-pixels close to the small hole in a column of sets of first color sub-pixels adjacent to the small hole is located, the second pixel unit is a pixel unit in which a first color sub-pixel relatively away from the small hole in the set of the first color sub-pixels close to the small hole is located, and the third pixel unit is a pixel unit in which a third color sub-pixel close to the small hole in a column of third color sub-pixels adjacent to the small hole is located and the first color sub-pixel is close to the small hole.

In some exemplary embodiments, two first color sub-pixels form a set of first color sub-pixels, and in a plane parallel to the baseplate, sets of the first color sub-pixels are arranged in multiple rows, the second color sub-pixels are arranged in multiple rows, the third color sub-pixels are arranged in multiple rows, any three adjacent rows of sub-pixels include a row of sets of first color sub-pixels, a row of second color sub-pixels and a row of third color sub-pixels, the sets of first color sub-pixels in the row of the sets of the first color sub-pixels and the second color sub-pixels and the third color sub-pixels in the adjacent rows are arranged in a staggered manner, the two first color sub-pixels of the set of the first color sub-pixels are arranged at intervals along a direction of the row, and a first color sub-pixel and an adjacent second color sub-pixel and an adjacent third color sub-pixel in the row of the second color sub-pixels and the row of the third color sub-pixels which are adjacent to the row of the sets of the first color sub-pixels form a pixel unit.

In some exemplary embodiments, in the plane parallel to the baseplate and in a direction perpendicular to the row, a width of the second color sub-pixel is greater than a width of the first color sub-pixel, and the width of the first color sub-pixel is greater than a width of the third color sub-pixel.

In some exemplary embodiments, the small hole is arranged in the row of the third color sub-pixels, and is located between two adjacent third color sub-pixels and close to an end of one of the two third color sub-pixels, the first display region includes a first pixel unit, a second pixel unit and a third pixel unit, wherein the first pixel unit is a pixel unit in which a first color sub-pixel relatively close to the small hole in a set of first color sub-pixels close to the small hole in a row of sets of first color sub-pixels adjacent to the small hole is located, the second pixel unit is a pixel unit in which a first color sub-pixel relatively away from the small hole in the set of the first color sub-pixels close to the small hole is located, and the third pixel unit is a pixel unit in which a second color sub-pixel close to the small hole in a row of second color sub-pixels adjacent to the small hole is located and the first color sub-pixel is close to the small hole.

In some exemplary embodiments, the small hole is arranged in the row of the second color sub-pixels, and is located between two adjacent second color sub-pixels and close to an end of one of the two second color sub-pixels, the first display region includes a first pixel unit, a second pixel unit and a third pixel unit, wherein the first pixel unit is a pixel unit in which a first color sub-pixel relatively close to the small hole in a set of first color sub-pixels close to the small hole in a row of sets of first color sub-pixels adjacent to the small hole is located, the second pixel unit is a pixel unit in which a first color sub-pixel relatively away from the small hole in the set of the first color sub-pixels close to the small hole is located, and the third pixel unit is a pixel unit in which a third color sub-pixel close to the small hole in a row of third color sub-pixels adjacent to the small hole is located and the first color sub-pixel is close to the small hole.

In some exemplary embodiments, a distance a the pixel luminance center of the first pixel unit and a center of the small hole is set to a first distance, a distance between a pixel luminance center of the second pixel unit and the center of the small hole is set to a second distance, and a distance between a pixel luminance center of the third pixel unit and the center of the small hole is set to a third distance, the first distance is less than the third distance, and the third distance is less than the second distance.

In some exemplary embodiments, the first color sub-pixel emits light at a positive view angle, and light filtered out by the filter unit is emitted at a squint view angle.

An embodiment of the present disclosure provides a display apparatus including the display substrate according to any of the embodiments described above.

An embodiment of the present disclosure provides a method for manufacturing a display substrate, which includes:

forming multiple pixel units on a baseplate, wherein a pixel unit includes multiple sub-pixels, the multiple sub-pixels includes a first color sub-pixel, at least one of the sub-pixels includes a color film structure layer, the color film structure layer includes a black matrix defining a pixel opening and a color film unit covering the pixel opening;

wherein the display substrate includes a first display region and a second display region located at a periphery of the first display region, and a small hole, which is filled with a filter unit, is provided on the black matrix in the first display region, a material of the filter unit is the same as a material of the color film unit of the first color sub-pixel, and an area of a first color sub-pixel in the first display region is less than an area of a first color sub-pixel in the second display region.

Other aspects may become clear upon reading and understanding of the drawings and the detailed description.

BRIEF DESCRIPTION OF DRAWINGS

The drawings are intended to provide a further understanding of technical solutions of the present disclosure and form a part of the specification, and are intended to explain the technical solutions of the present disclosure together with embodiments of the present disclosure and do not constitute a limitation on the technical solutions of the present disclosure.

DETAILED DESCRIPTION

Embodiments of the present disclosure will be described in detail with reference to the drawings. The embodiments in the present disclosure and features in the embodiments can be randomly combined with each other if there is no conflict.

In a display panel based on the COE technology, a color film structure layer composed of a black matrix and a color film unit is used in place of a polarizer. Because a thickness of a common polarizer is about 50 microns, while the color film structure layer usually has a thickness of about 10 microns, a display panel based on the COE technology is thinner and easier to bend or curl than a conventional display panel with a polarizer.

Figure 1:
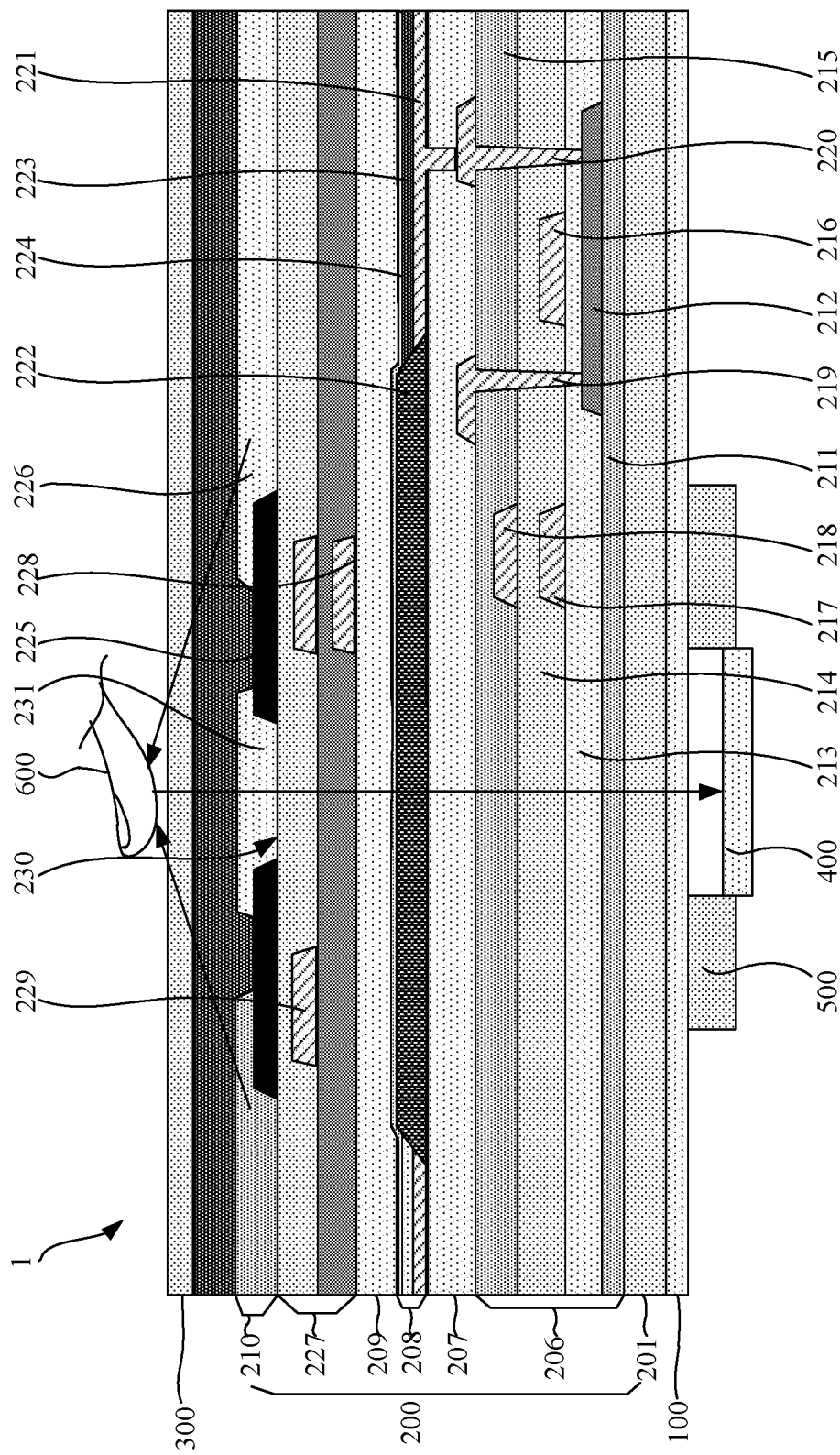
FIG. 1 is a schematic structural diagram of a display panel.
Figure 2:
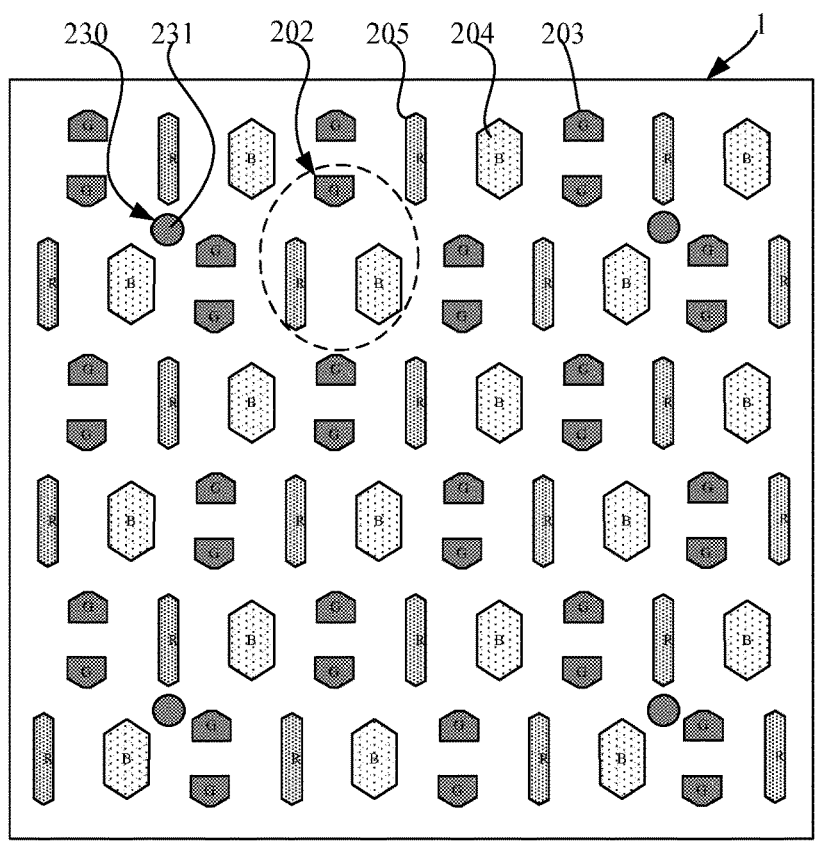
FIG. 2 is a plan view of the display panel shown in FIG. 1.

FIG. 1 is a schematic structural diagram of a display panel, and FIG. 2 is a plan view of the display panel shown in FIG. 1. As shown in FIGS. 1 and 2, a main structure of the display panel 1 includes a back film 100, a display substrate 200 disposed on the back film 100, and a cover plate 300 covering one side of the display substrate 200 away from the back film 100. The display substrate 200 is bonded to the back film 100 by an optical adhesive, and the cover plate 300 is bonded to the display substrate 200 by an optical adhesive. The display substrate 200 includes multiple pixel units 202 disposed on a baseplate 201, a pixel unit 202 includes multiple sub-pixels, wherein the multiple sub-pixels may include a first color sub-pixel 203, a second color sub-pixel 204, and a third color sub-pixel 205. The first color sub-pixel 203 may be a green light sub-pixel, the second color sub-pixel 204 may be a blue light sub-pixel, and the third color sub-pixel 205 may be a red light sub-pixel. At least one sub-pixel includes an array structure layer 206, a planarization layer 207, a light emitting structure layer 208, an encapsulation layer 209 and a color film structure layer 210 disposed at one side of the baseplate 201 away from the back film 100. The array structure layer 206 includes a first insulating layer 211, an active layer 212, a second insulating layer 213, a first gate metal layer, a third insulating layer 214, a second gate metal layer, a fourth insulating layer 215 and a source-drain metal layer which are stacked. The first gate metal layer includes a gate electrode 216 and a first capacitor electrode 217. The gate electrode 216 corresponds to the active layer 212 in position, and an orthographic projection of the gate electrode 216 on the baseplate 201 overlaps with an orthographic projection of the active layer 212 on the baseplate 201. The second gate metal layer includes a second capacitor electrode 218, and an orthographic projection of the first capacitor electrode 217 on the baseplate 201 overlaps with an orthographic projection of the second capacitor electrode 218 on the baseplate 201. A first via hole is provided in the fourth insulating layer 215, and the second insulating layer 213, the third insulating layer 214 and the fourth insulating layer 215 in the first via hole are etched away to expose the active layer 212. The source-drain metal layer includes a source electrode 219 and a drain electrode 220 connected to the active layer 212 through the first via hole. The active layer 212, the gate electrode 216, the source electrode 219 and the drain electrode 220 form a thin film transistor, and the first capacitor electrode 217 and the second capacitor electrode 218 form a storage capacitor. The planarization layer 207 covers the source-drain metal layer and the fourth insulating layer 215, and a second via hole exposing the drain electrode 220 is provided in the planarization layer 207. The light emitting structure layer 208 includes an anode 221, a pixel definition layer 222, an organic light emitting layer 223 and a cathode 224. The anode 221 is connected to the drain electrode 220 through the second via hole, and the pixel definition layer 222 covers the anode 221. A first pixel opening exposing the anode 221 and defining a pixel region is provided in the pixel definition layer 222, and the organic light emitting layer 223 is disposed within the first pixel opening. The organic light emitting layer 223 may include a hole injection layer, a hole transport layer, a light emitting layer, an electron transport layer and an electron injection layer. The cathode 224 covers the pixel definition layer 222 and the organic light emitting layer 223. The encapsulation layer 209 is disposed on the cathode 224. The color film structure layer 210 includes a black matrix 225 disposed on the encapsulation layer 209 and a color film unit 226 disposed on the black matrix 225. A second pixel opening is provided in the black matrix 225, the color film unit 226 covers the second pixel opening, the color film unit 226 corresponds to the organic light emitting layer 223 in position, and a color of light emitted from the organic light emitting layer 223 is the same as a color of light filtered out by the corresponding color film unit 226. The display substrate 200 may further include a touch structure layer 227 disposed between the encapsulation layer 209 and the color film structure layer 210. The touch structure layer 227 includes a first touch electrode layer 228 and a second touch electrode layer 229 that are stacked.

As shown in FIG. 1, in an optical fingerprint identification structure of the display panel 1 based on the COE technology, an optical sensor 400 is bonded to one side of the back film 100 away from the cover plate 300 by an adhesive tape 500. Since the black matrix 225 is light-proof, a small hole 230 is provided at a position on the black matrix 225 corresponding to the optical sensor 400, and an orthographic projection of the small hole 230 on the baseplate 201 overlaps with an orthographic projection of the optical sensor 400 on the baseplate 201. According to the pinhole imaging principle, light emitted from the display substrate 200 strikes a finger 600, and light reflected by the finger 600 passes through the encapsulation layer 209, the light emitting structure layer 208 and the array structure layer 206 through the small hole 230 to be imaged on the optical sensor 400, thereby implementing fingerprint identification.

Because the human finger 600 has a certain transmittance to infrared light, in order to improve light utilization rate of the display substrate 200 and prevent infrared light in external light from entering the optical sensor 400 through the finger to interfere with the accuracy of fingerprint identification, green light (with a higher light emitting efficiency) or a combination of green light and blue light will generally be used in fingerprint identification. Therefore, as shown in FIGS. 1 and 2, the small hole 230 may be filled with a filter unit 231, wherein the filter unit 231 usually uses green filter materials, which allows green light to pass through.

As shown in FIG. 2, during the fingerprint identification, only the first color sub-pixels 203 in the multiple pixel units 202 of the display panel 1 emit green light and there is no problem with displaying. During normal display of the screen, in addition to the first color sub-pixels 203, the second color sub-pixels 204 and the third color sub-pixels 205 of the pixel units 202 emitting light, the filter units 231 in the small holes 230 also filters out green light, so the intensity of the green light around the small holes 230 is excessive, resulting in a color shift phenomenon.

An embodiment of the present disclosure provides a display substrate including a baseplate and multiple pixel units arranged on the baseplate, wherein a pixel unit includes multiple sub-pixels. The multiple sub-pixels includes a first color sub-pixel, at least one sub-pixel includes a color film structure layer. The color film structure layer includes a black matrix defining a pixel opening and a color film unit covering the pixel opening. The display substrate includes a first display region and a second display region located at a periphery of the first display region. A small hole, which is filled with a filter unit, is provided on the black matrix in the first display region. A material of the filter unit is the same as a material of the color film unit of the first color sub-pixel. An area of the first color sub-pixel in the first display region is less than an area of the first color sub-pixel in the second display region.

In the display substrate according to the embodiment of the present disclosure, of the excessive intensity of light of first color in the first display region caused by light of first color filtered out by the filter unit in the small hole is prevented by setting the area of the first color sub-pixel in the first display region to be less than the area of the first color sub-pixel in the second display region, thereby eliminating color shift of the first display region.

A technical solution of a display panel according to an exemplary embodiment of the present disclosure will be exemplarily described below with reference to the accompanying drawings.

Figure 3:
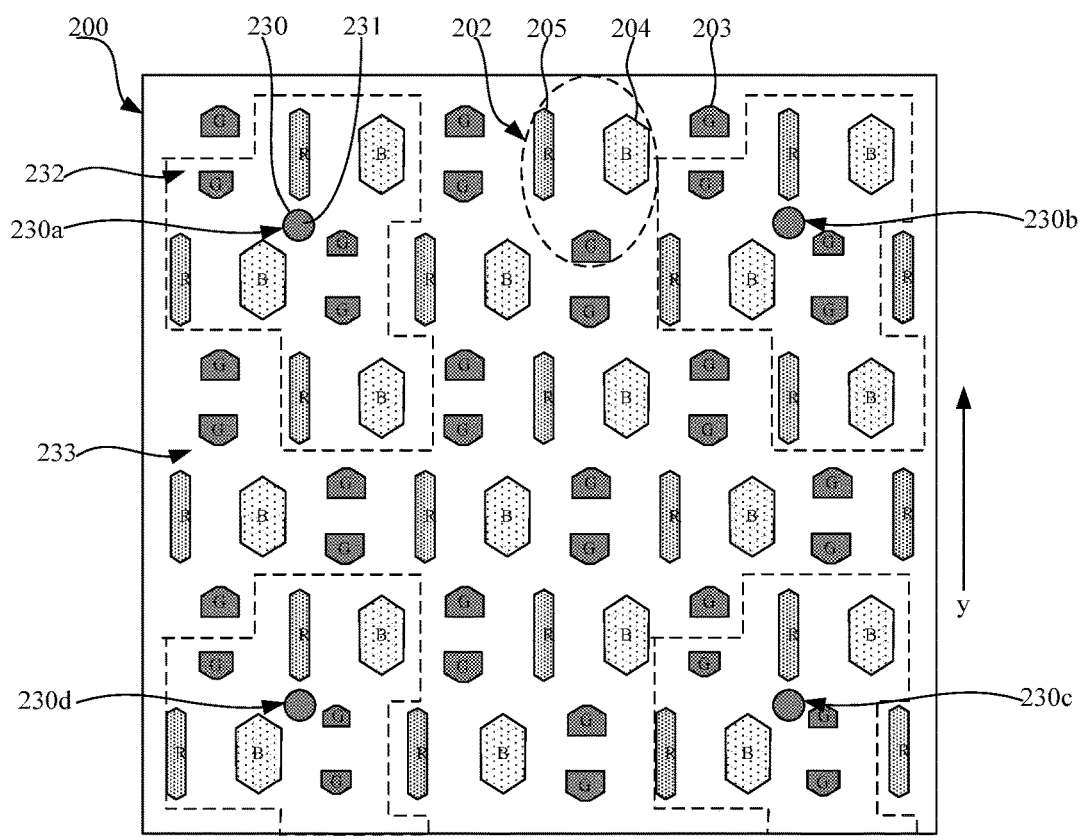
FIG. 3 is a plan view of a display substrate according to an exemplary embodiment of the present disclosure.
Figure 4:
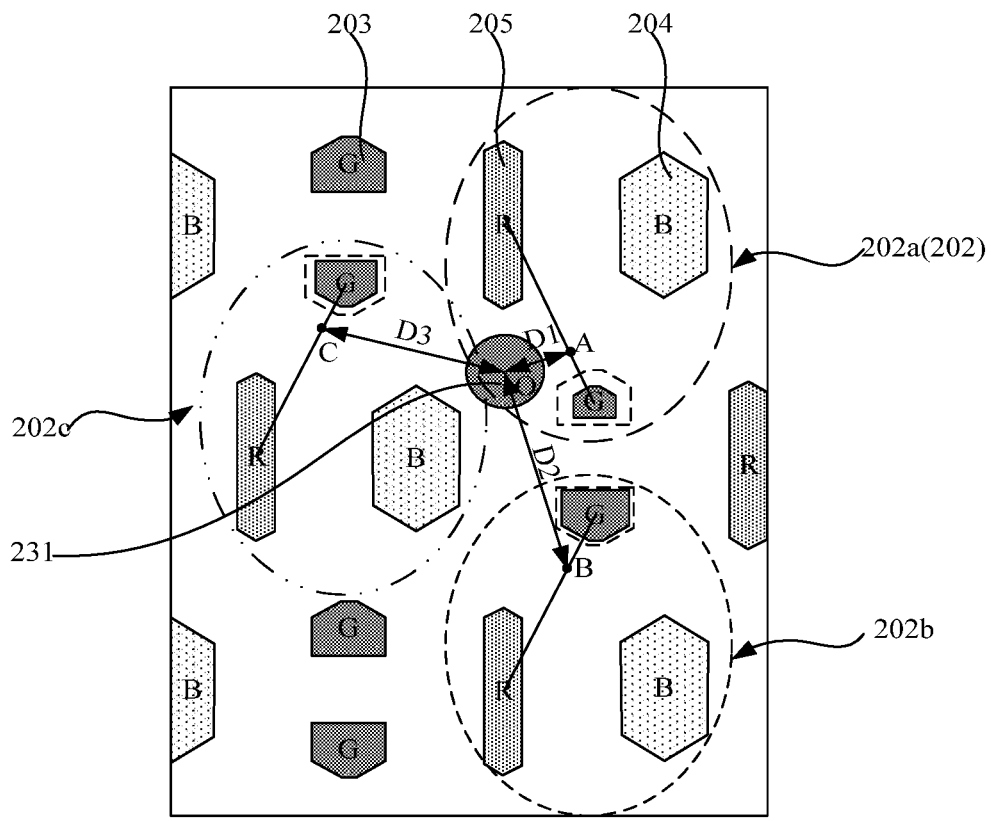
FIG. 4 is an enlarged view of a first display region in FIG. 3.

FIG. 3 is a plan view of a display substrate according to an exemplary embodiment of the present disclosure. FIG. 4 is an enlarged view of a first display region in FIG. 3, in which a dashed line frame around a first color sub-pixel 203 in a first display region 232 in FIG. 4 and having a same shape as the first color sub-pixel 203 represents an area of a first color sub-pixel 203 in a second display region 233. In some exemplary embodiments, as shown in FIGS. 1, 3 and 4, a display substrate 200 includes a baseplate and multiple pixel units 202 disposed on the baseplate, at least one pixel unit 202 includes multiple sub-pixels, wherein the multiple sub-pixels includes a first color sub-pixel 203. At least one sub-pixel includes a color film structure layer 210. The color film structure layer 210 serves as an antireflection layer to reduce reflection of reflective metals to external ambient light. The color film structure layer 210 includes a black matrix 225 defining a pixel opening and a color film unit 226 covering the pixel opening. The display substrate 200 includes a first display region 232 and a second display region 233 located at a periphery of the first display region 232. A small hole 230 is provided on the black matrix 225 in the first display region 232. An orthographic projection of the small hole 230 on the baseplate 201 overlaps with an orthographic projection of an optical sensor 400 on the baseplate 201. The small hole 230 is filled with a filter unit 231, and is configured to image a fingerprint on the optical sensor 400. A material of the color film unit 226 of the first color sub-pixel 203 is the same as a material of the filter unit 231, and an area of the first color sub-pixel 203 in the first display region 232 is less than the area of the first color sub-pixel 203 in the second display region 233, therefore an area of the color film unit 226 of the first color sub-pixel 203 in the first display region 232 is less than an area of the color film unit 226 of the first color sub-pixel 203 in the second display region 233.

In the display substrate 200 according to the present exemplary embodiment, excessive intensity of light of first color in the first display region caused by light of first color filtered out by the filter unit 231 in the small hole 230 is prevented by setting the area of the first color sub-pixel 203 in the first display region 232 to be less than the area of the first color sub-pixel 203 in the second display region 233, thereby eliminating the color shift of the first display region 232.

In some exemplary embodiments, as shown in FIGS. 1 and 3, at least one sub-pixel further includes an array structure layer 206 disposed on the baseplate 201, a planarization layer 207 covering the array structure layer 206, a light emitting structure layer 208 disposed on the planarization layer 207, and an encapsulation layer 209 covering the light emitting structure layer 208, wherein the color film structure layer 210 is disposed on the encapsulation layer 209. The array structure layer 206 includes a thin film transistor and a storage capacitor. The light emitting structure layer 208 includes an anode 221, a pixel definition layer 222, an organic light emitting layer 223 and a cathode 224. The anode 221 is connected to a drain electrode 220 of the thin film transistor through a via hole, the pixel definition layer 222 covers the anode 221, a first pixel opening exposing the anode 221 and defining a pixel region is provided in the pixel definition layer 222, the organic light emitting layer 223 is disposed in the first pixel opening, the cathode 224 covers the pixel definition layer 222 and the organic light emitting layer 223, and the encapsulation layer 209 covers the cathode 224. The organic light emitting layer 223 corresponds to the color film unit 226 in position, and a color of light filtered out by the color film unit 226 is the same as a color of light emitted from the corresponding organic light emitting layer 223. The multiple sub-pixels may also include a second color sub-pixel 204 and a third color sub-pixel 205 in addition to the first color sub-pixel 203. Because the area of the first color sub-pixel 203 in the first display region 232 is less than the area of the first color sub-pixel 203 in the second display region 233, an area of the organic light emitting layer 223 of the first color sub-pixel 203 in the first display region 232 is less than an area of the organic light emitting layer 223 of the first color sub-pixel 203 in the second display region 233.

In some exemplary embodiments, multiple first display regions 232 are provided, and the first display region 232 includes at least one small hole 230. FIG. 3 shows a plan view of the display substrate 200 including four small holes 230, which are respectively a first small hole 230a, a second small hole 230b, a third small hole 230c and a fourth small hole 230d. Each of the small holes 230 corresponds to one first display region 232 (a region defined by the dashed line frame in FIG. 3), and a periphery of the multiple first display regions 232 is the second display region 233. An area of a first color sub-pixel 203 in the multiple first display regions 232 is less than an area of a first color sub-pixel 203 in the second display region 233, an area of a second color sub-pixel 204 in the multiple first display regions 232 is equal to an area of a second color sub-pixel 204 in the second display region 233, and an area of a third color sub-pixel 205 in the first display regions 232 is equal to an area of the third color sub-pixel 205 in the second display region 233.

In some exemplary embodiments, as shown in FIG. 4, light filtered out by the filter unit 231 is green light, the first color sub-pixel 203 is a green light sub-pixel, the second color sub-pixel 204 may be a blue light sub-pixel, and the third color sub-pixel 205 may be a red light sub-pixel, so the pixel unit 202 is an RGB pixel unit. In the exemplary embodiment, the area of the first color sub-pixel 203 in the first display region 232 is proportional directly to a distance between a pixel luminance center of the pixel unit 202 where the first color sub-unit 203 is located and a center of a small hole 230, that is to say, the greater the distance between the pixel luminance center of the pixel unit 202 and the center of the small hole 230, the larger the area of the corresponding first color sub-pixel 203, wherein the pixel luminance center is a position which is located on a line connecting a pixel center of the red light sub-pixel and a pixel center of the green light sub-pixel and is at 30% of a distance from the pixel center of the green light sub-pixel and at 70% of a distance from the pixel center of the red light sub-pixel.

In some exemplary embodiments, as shown in FIGS. 3 and 4, the area of the second color sub-pixel 204 is greater than the area of the third color sub-pixel 205, and the area of the third color sub-pixel 205 is greater than the area of the first color sub-pixel 203. Two first color sub-pixels 203 form a set of first color sub-pixels 203. In a plane parallel to the baseplate 201, sets of first color sub-pixels 203 are arranged in multiple columns, second color sub-pixels 204 are arranged in multiple columns, third color sub-pixels 205 are arranged in multiple columns. Any three adjacent columns of sub-pixels include a column of sets of first color sub-pixels 203, a column of second color sub-pixels 204 and a column of third color sub-pixels 205. The sets of first color sub-pixels in the column of sets of first color sub-pixels 203 the second color sub-pixels 204 and the third color sub-pixels 205 in the adjacent columns are arranged in a staggered manner, the two first color sub-pixels 203 of the set of first color sub-pixels 203 are arranged at intervals along a column direction, which is the Y direction in FIG. 3. A first color sub-pixel 203 and adjacent second color sub-pixel 204 and third color sub-pixel 205 in the column of second color sub-pixels 204 and the column of third color sub-pixels 205 which are adjacent to the column of the sets of first color sub-pixels 203 form a pixel unit 202 in a delta form. In the plane parallel to the baseplate 201 and in a direction perpendicular to the column direction, a width of the second color sub-pixel 204 is greater than a width of first color sub-pixel 203, and the width of the first color sub-pixels 203 is greater than a width of the third color sub-pixel 205. In another exemplary embodiment, in the column direction, an overall length of a set of first color sub-pixels 203 may be 0.5 to 2 times of a length of the second color sub-pixel 204, and may be 0.5 to 2 times of a length of the third color sub-pixel 205, and an overall length of the set of first color sub-pixels 203 may be understood to be a distance between farthest ends of the two first color sub-pixels 203 that are away from each other in the column direction. In the exemplary embodiment, in the plane parallel to the baseplate 201, the first color sub-pixel 203 is pentagonal, the second color sub-pixel 204 and the third color sub-pixel 205 are hexagonal. The first color sub-pixel 203 is symmetric with respect to a first axis parallel to the column direction and passing through a pixel center of the first color sub-pixel 203. The second color sub-pixel 204 is symmetric with respect to a second axis parallel to the column direction and passing through a pixel center of the second color sub-pixel 204, wherein the second axis passes through a first vertex and a fourth vertex of the hexagon in the clockwise direction. The third color sub-pixel 205 is symmetric with respect to a third axis parallel to the column direction and passing through a pixel center of the third color sub-pixel 205, wherein the third axis passes through a first vertex and a fourth vertex of the hexagon in the clockwise direction.

In some exemplary embodiments, as shown in FIGS. 3 and 4, a small hole 230 is provided in the column of third color sub-pixels 205 and is located between two adjacent third color sub-pixels 205 and close to an end of one of the two third color sub-pixels 205. The first display region 232 includes a first pixel unit 202a, a second pixel unit 202b and a third pixel unit 202c. The first pixel unit 202a is a pixel unit 202 in which a first color sub-pixel 203 relatively close to the small hole 230 in the set of first color sub-pixels 203 close to the small hole 230 in the column of sets of first color sub-pixels 203 adjacent to the small hole 230 is located, the second pixel unit 202b is a pixel unit 202 in which a first color sub-pixel 203 relatively away from the small hole 230 in the set of first color sub-pixels 203 adjacent to the small hole 230 is located, and the third pixel unit 202c is a pixel unit 202 in which the second color sub-pixel 204 close to the small hole 230 in the column of second color sub-pixels 204 adjacent to the small hole 230 is located and the first color sub-pixel 203 is close to the small hole 230. In this example, the center of the small hole 230, which is provided in the column of third color sub-pixels 205 including the small hole 230, may be on a line connecting the pixel centers of multiple third color sub-pixels 205 of the column of the third color sub-pixels 205, or the center of the small hole 230 may be slightly deviated from the line connecting the pixel centers of the multiple third color sub-pixels 205 of the column of third color sub-pixels 205. Slight deviation may mean that a distance from the center of the small hole 230 to the line connecting the pixel centers of the multiple third color sub-pixels 205 in the column of third color sub-pixels 205 is within a range of less than 20 microns.

Figure 5:
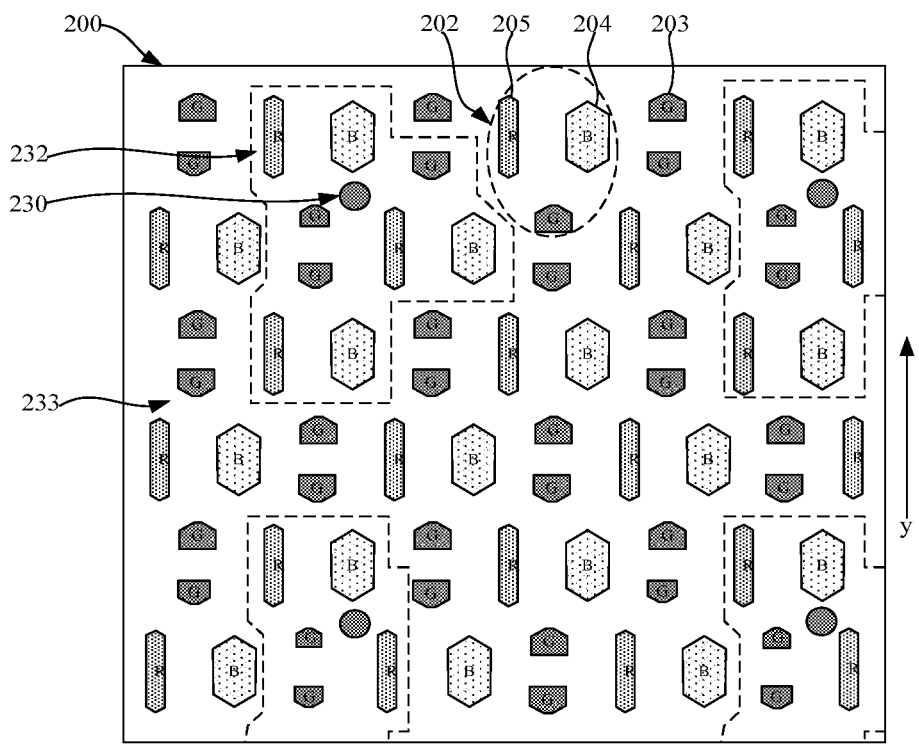
FIG. 5 is a plan diagram of another display substrate according to an exemplary embodiment of the present disclosure.
Figure 6:
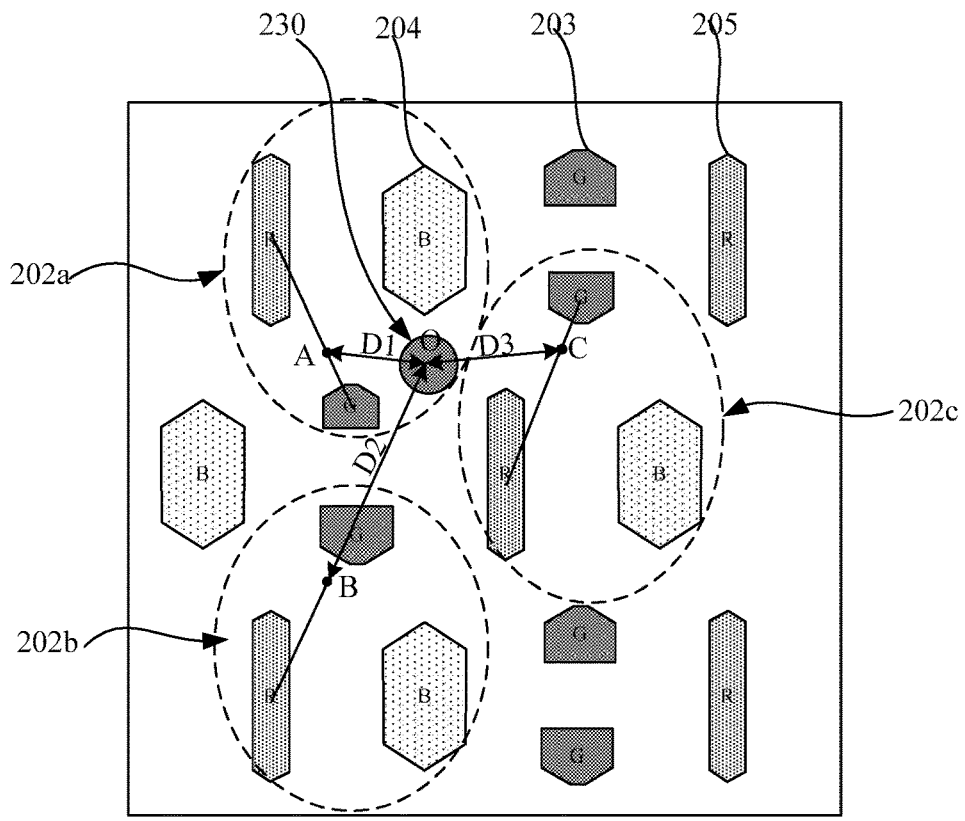
FIG. 6 is an enlarged view of a first display region in FIG. 5.

FIG. 5 is a plan diagram of another display substrate according to an exemplary embodiment of the present disclosure. FIG. 6 is an enlarged view of a first display region in FIG. 5. In some other exemplary embodiments, as shown in FIGS. 5 and 6, a small hole 230 is provided in a column of second color sub-pixels 204 and is located between two adjacent second color sub-pixels 204 and close to an end of one of the two second color sub-pixels 204. A first display region 232 includes a first pixel unit 202a, a second pixel unit 202b and a third pixel unit 202c. The first pixel unit 202a is a pixel unit 202 in which a first color sub-pixel 203 relatively close to the small hole 230 in the set of first color sub-pixels 203 close to the small hole 230 in the column of sets of first color sub-pixels 203 adjacent to the small hole 230 is located, the second pixel unit 202b is a pixel unit 202 in which a first color sub-pixel 203 relatively away from the small hole 230 in the set of first color sub-pixels 203 close to the small hole 230 is located, and the third pixel unit 202c is a pixel unit 202 in which a third color sub-pixel 205 close to the small hole 230 in the column of third color sub-pixels 205 adjacent to the small hole 230 is located and the first color sub-pixel 203 is close to the small hole 230. In this example, the center of the small hole 230, which is provided in the column of second color sub-pixels 204 including the small hole 230, may be on a line connecting the pixel centers of multiple second color sub-pixels 204 of the column of second color sub-pixels 204, or the center of the small hole 230 may be slightly deviated from the line connecting the pixel centers of the multiple second color sub-pixels 204 of the column of the second color sub-pixels 204. Slight deviation may mean that a distance from the center of the small hole 230 to the line connecting the pixel centers of the multiple second color sub-pixels 204 of the column of second color sub-pixels 204 is within a range of less than 20 microns.

In some exemplary embodiments, the small hole 230 may also be located in the column of sets of first color sub-pixels 203, wherein a diameter of the small hole 230 and a distance between the center of the small hole 230 and a pixel center of the adjacent first color sub-pixel 203 are set according to actual needs. The small hole 230 may be located in the middle of adjacent sets of first color sub-pixels 203 or may be located between the adjacent sets of first color sub-pixels 203 and close to one of the sets of first color sub-pixels. The first display region 232 includes at least a pixel unit 202 in which a first color sub-pixel 203 close to the small hole 230 in the column of sets of first color sub-pixels 203 where the small hole 230 is located is located. In this example, the center of the small hole 230, which is provided in the column of sets of first color sub-pixels 203 including the small hole 230, may be on a line connecting the pixel centers of multiple first color sub-pixels 203 of the column of sets of first color sub-pixels 203, or the center of the small hole 230 may be slightly deviated from the line connecting the pixel centers of the multiple first color sub-pixels 203 of the column of sets of first color sub-pixels 203. Slight deviation may mean that a distance from the center of the small hole 230 to the line connecting the pixel centers of the multiple first color sub-pixels 203 of the column of sets of first color sub-pixels 203 is within a range of less than 20 microns.

Figure 7:
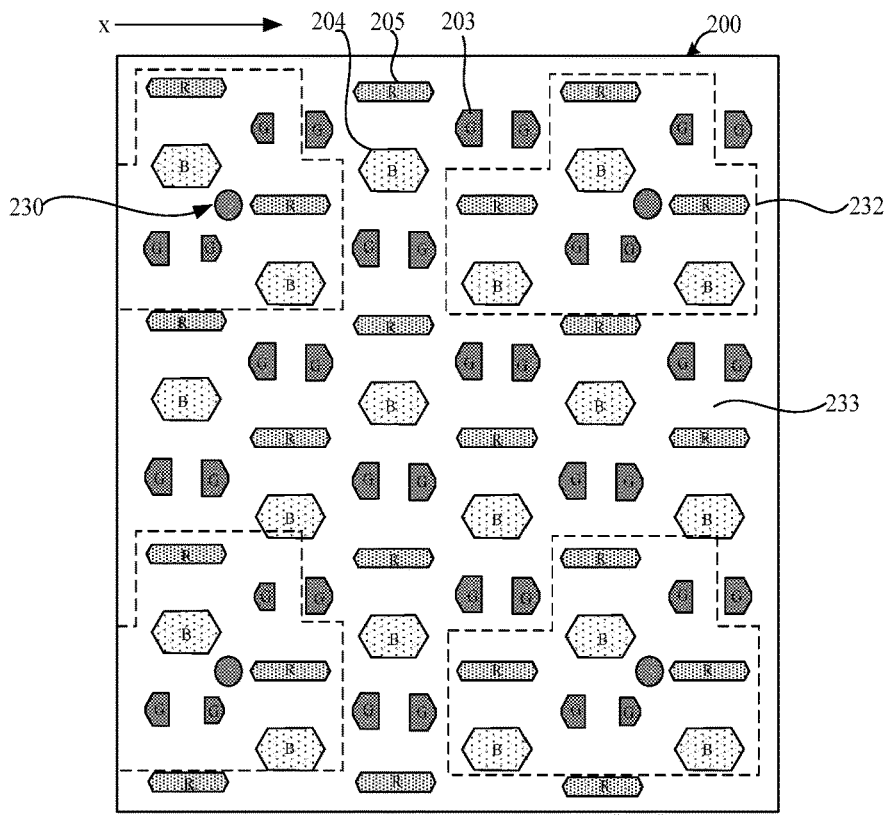
FIG. 7 is a plan view of another display substrate according to an exemplary embodiment of the present disclosure.
Figure 8:
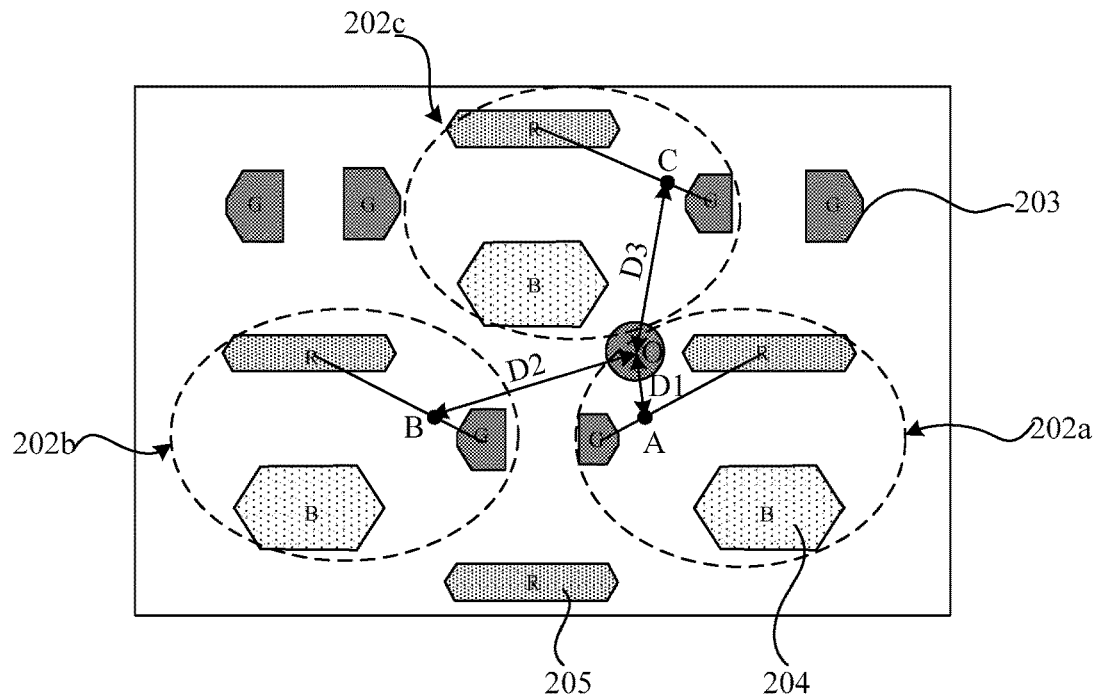
FIG. 8 is an enlarged view of a first display region in FIG. 7.

FIG. 7 is a plan diagram of another display substrate according to an exemplary embodiment of the present disclosure. FIG. 8 is an enlarged view of a first display region in FIG. 7. In some other exemplary embodiments, an area of a second color sub-pixel 204 is greater than an area of a third color sub-pixel 205, and an area of a third color sub-pixel 205 is greater than the area of the first color sub-pixel 203. Two first color sub-pixels 203 form a set of first color sub-pixels 203. In a plane parallel to a baseplate 201, sets of first color sub-pixels 203 are arranged in multiple rows, second color sub-pixels 204 are arranged in multiple rows, third color sub-pixels 205 are arranged in multiple rows. Any three adjacent rows of sub-pixels include a row of sets of first color sub-pixels 203, a row of second color sub-pixels 204 and a row of third color sub-pixels 205. The sets of first color sub-pixels in the row of sets of first color sub-pixels 203 and the second color sub-pixels 204 and the third color sub-pixels 205 in the adjacent rows are arranged in a staggered manner. The two first color sub-pixels 203 of the set of first color sub-pixels 203 are arranged at intervals along a row direction, which is the X direction in FIG. 7. A first color sub-pixel 203 and the adjacent second color sub-pixel 204 and third color sub-pixel 205 in the row of second color sub-pixels and the row of third color sub-pixels which are adjacent to the row of the sets of first color sub-pixels form a pixel unit 202 in a delta shape. In the plane parallel to the baseplate 201 and in a direction perpendicular to the row direction, a width of the second color sub-pixel 204 is greater than a width of first color sub-pixel 203, and the width of the first color sub-pixels 203 is greater than a width of the third color sub-pixel 205. In another exemplary embodiment, in the row direction, an overall length of the set of first color sub-pixels 203 may be 0.5 to 2 times of a length of the second color sub-pixel 204, and may be 0.5 to 2 times of a length of the third color sub-pixel 205, wherein the overall length of the set of first color sub-pixels 203 may be understood to be a distance between the farthest ends of the two first color sub-pixels 203 that are far away from each other in the row direction. In the exemplary embodiment, in the plane parallel to the baseplate 201, the first color sub-pixel 203 is pentagonal, the second color sub-pixel 204 and the third color sub-pixel 205 are hexagonal. The first color sub-pixel 203 is symmetric with respect to a first axis parallel to the row direction and passing a the pixel center of the first color sub-pixel 203. The second color sub-pixel 204 is symmetric with respect to a second axis parallel to the row direction and passing through a pixel center of the second color sub-pixel 204, wherein the second axis passes through a first vertex and a fourth vertex of the hexagon in the clockwise direction. The third color sub-pixel 205 is symmetric with respect to a third axis parallel to the row direction and passing through the pixel center of the third color sub-pixel 205, and the third axis passes through a first vertex and a fourth vertex of the hexagon in the clockwise direction.

In some exemplary embodiments, as shown in FIGS. 7 and 8, a small hole 230 is provided in the row of third color sub-pixels 205 and is located between two adjacent third color sub-pixels 205 and close to an end of one of the two third color sub-pixels 205. A first display region 232 includes a first pixel unit 202a, a second pixel unit 202b and a third pixel unit 202c. The first pixel unit 202a is a pixel unit 202 in which a first color sub-pixel 203 relatively close to the small hole 230 in the set of first color sub-pixels 203 close to the small hole 230 in the row of sets of first color sub-pixels 203 adjacent to the small hole 230 is located. The second pixel unit 202b is a pixel unit 202 in which a first color sub-pixel 203 relatively away from the small hole 230 in the set of first color sub-pixels 203 close to the small hole 230 is located. The third pixel unit 202c is a pixel unit 202 in which a second color sub-pixel 204 close to the small hole 230 in the row of second color sub-pixels 204 adjacent to the small hole 230 is located and the first color sub-pixel 203 is close to the small hole 230. In this example, the center of the small hole 230, which is provided in the row of third color sub-pixels 205 including the small hole 230, may be on a line connecting the pixel centers of multiple third color sub-pixels 205 of the row of third color sub-pixels 205, or the center of the small hole 230 may be slightly deviated from the line connecting the pixel centers of the multiple third color sub-pixels 205 of the row of third color sub-pixels 205. Slight deviation may mean that a distance from the center of the small hole 230 to the line connecting the pixel centers of the multiple third color sub-pixels 205 of the row of third color sub-pixels 205 is within a range of less than 20 microns.

Figure 9:
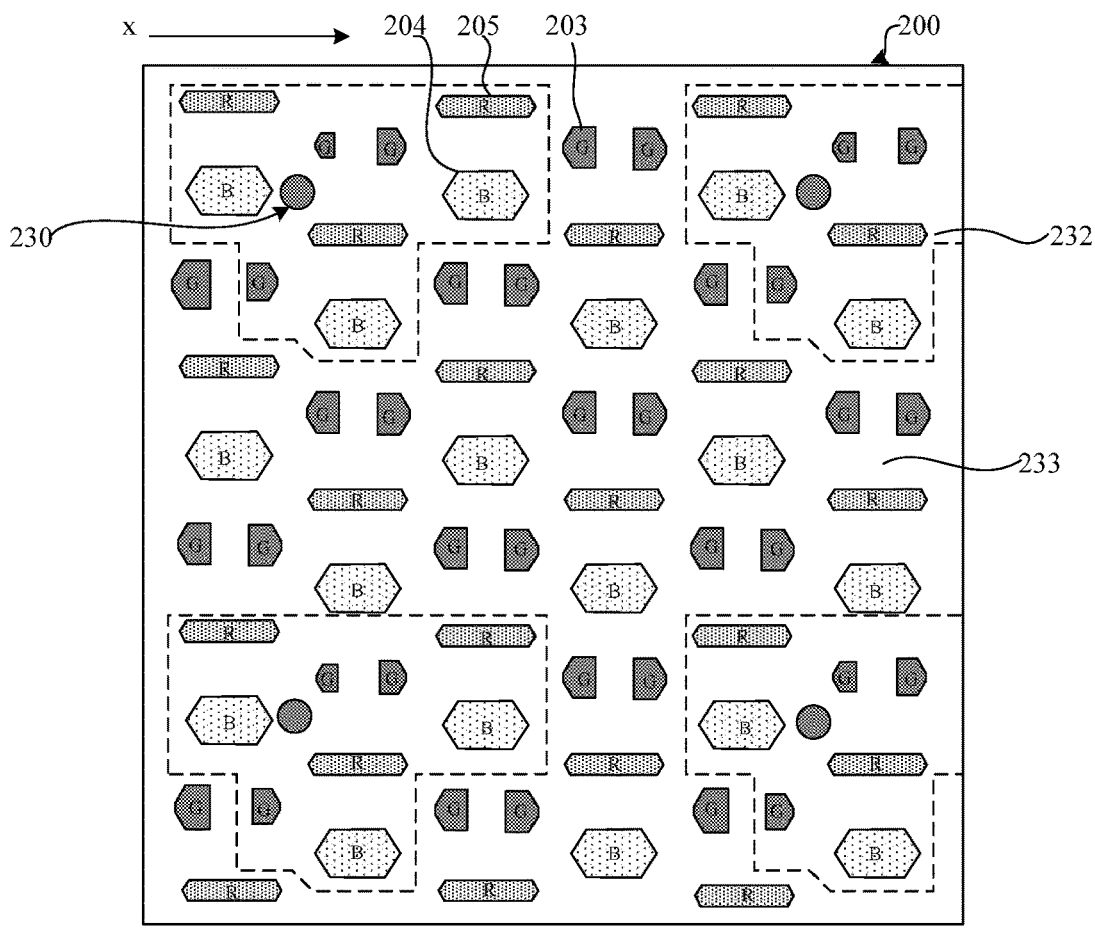
FIG. 9 is a plan view of another display substrate according to an exemplary embodiment of the present disclosure.
Figure 10:
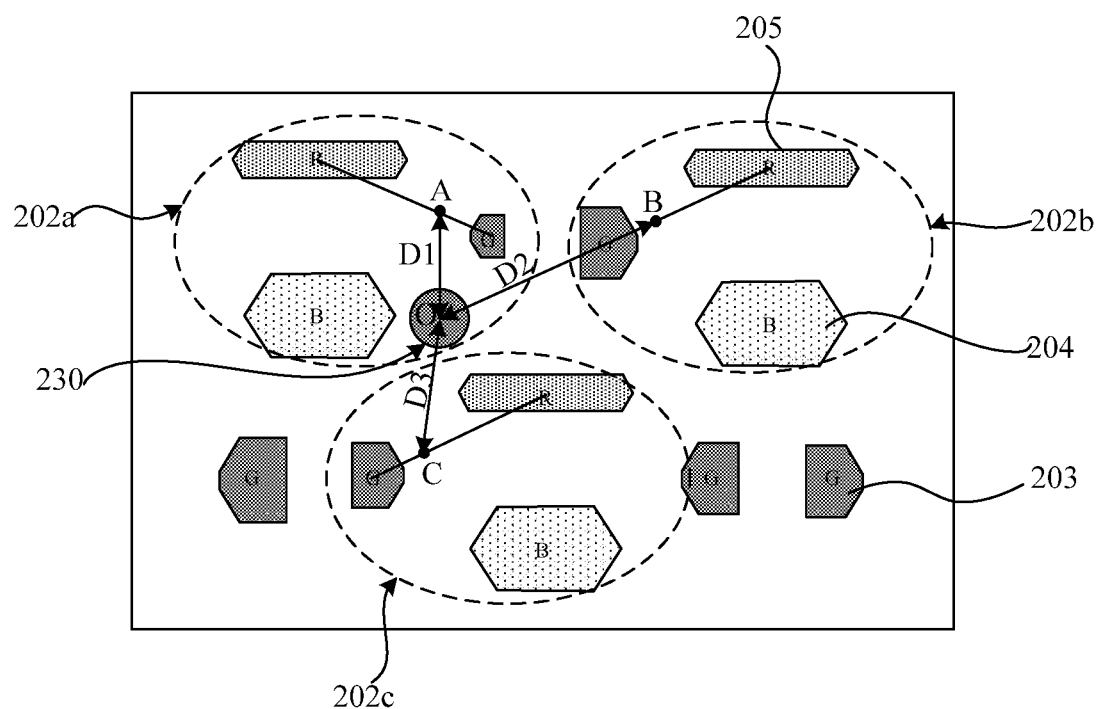
FIG. 10 is an enlarged view of a first display region in FIG. 9.

FIG. 9 is a plan diagram of another display substrate according to an exemplary embodiment of the present disclosure. FIG. 10 is an enlarged view of a first display region in FIG. 9. In another exemplary embodiment, as shown in FIGS. 9 and 10, a small hole 230 is provided in a row of second color sub-pixels 204 and is located between two adjacent second color sub-pixels 204 and close to an end of one of the two second color sub-pixels 204. A first display region 232 includes a first pixel unit 202a, a second pixel unit 202b and a third pixel unit 202c. The first pixel unit 202a is a pixel unit 202 in which a first color sub-pixel 203 relatively close to the small hole 230 in the set of first color sub-pixels 203 close to the small hole 230 in the row of sets of first color sub-pixels 203 adjacent to the small hole 230 is located. The second pixel unit 202b is a pixel unit 202 in which a first color sub-pixel 203 relatively away from the small hole 230 in the set of first color sub-pixels 203 close to the small hole 230 is located. The third pixel unit 202c is a pixel unit 202 in which a third color sub-pixel 205 close to the small hole 230 in the row of third color sub-pixels 205 adjacent to the small hole 230 is located and the first color sub-pixel 203 is close to the small hole 230. In this example, the center of the small hole 230, which is provided in the row of second color sub-pixels 204 including the small hole 230, may be on a line connecting the pixel centers of multiple second color sub-pixels 204 of the row of second color sub-pixels 204, or the center of the small hole 230 may be slightly deviated from the line connecting the pixel centers of the multiple second color sub-pixels 204 of the row of second color sub-pixels 204. Slight deviation may mean that a distance from the center of the small hole 230 to the line connecting the pixel centers of the multiple second color sub-pixels 204 of the row of second color sub-pixels 204 is within a range of less than 20 microns.

In some exemplary embodiments, the small hole 230 may also be located in the row of sets of first color sub-pixels 203, wherein a diameter of the small hole 230 and a distance between the center of the small hole 230 and a pixel center of the adjacent first color sub-pixel 203 are set according to actual needs. The small hole 230 may be located in the middle of adjacent sets of first color sub-pixels 203 or may be located between the adjacent sets of first color sub-pixels 203 and close to one of the sets of first color sub-pixels. The first display region 232 includes at least a pixel unit 202 in which the first color sub-pixel 203 close to the small hole 230 in the row of sets of first color sub-pixels 203 where the small hole 230 is located is located. In this example, the center of the small hole 230, which is provided in the row of sets of first color sub-pixels 203 including the small hole 230, may be on a line connecting the pixel centers of multiple first color sub-pixels 203 of the row of sets of first color sub-pixels 203, or the center of the small hole 230 may be slightly deviated from the line connecting the pixel centers of the multiple first color sub-pixels 203 of the row of sets of first color sub-pixels 203. Slight deviation may mean that a distance from the center of the small hole 230 to the line connecting the pixel centers of the multiple first color sub-pixels 203 of the row of sets of first color sub-pixels 203 is within a range of less than 20 microns.

In some exemplary embodiments, as shown in FIGS. 4, 6, 8 and 10, a distance between a pixel luminance center A of the first pixel unit 202c and the center O of the small hole 230 is set to a first distance D1, a distance between a pixel luminance center B of the second pixel unit 202b and the center O of the small hole 230 is set to a second distance D2, and a distance between a pixel luminance center C of the third pixel unit 202c and the center O of the small hole 230 is set to a third distance D3. The first distance D1 is less than the third distance D3, and the third distance D3 is less than the second distance D2, that is, the first distance D1, the third distance D3 and the second distance D2 increase in turn, therefore in the first display region 232, an area of the first color sub-pixel 203 of the first pixel unit 202a is less than an area of the first color sub-pixel 203 of the third pixel unit 202c, and the area of the first color sub-pixel 203 of the third pixel unit 202c is less than an area of the first color sub-pixel 203 of the second pixel unit 202b. For example, the first distance D1 is 0.0137 mm, the second distance D2 is 0.0445 mm, and the third distance D3 is 0.0354 mm, correspondingly, the area of the first color sub-pixel 203 of the first pixel unit 202a is 41% of the area of the first color sub-pixel 203 of the second display region 233, the area of the first color sub-pixel 203 of the second pixel unit 202b is 81.8% of the area of the first color sub-pixel 203 of the second display region 233, and the area of the first color sub-pixel 203 of the third pixel unit 202c is 77.2% of the area of the first color sub-pixel 203 of the second display region 233. The areas of the second color sub-pixels 204 of the first pixel unit 202a, the second pixel unit 202b, and the third pixel unit 202c are the same and equal to an area of a second color sub-pixel 204 in the second display region 233. The areas of the third color sub-pixels 205 of the first pixel unit 202a, the second pixel unit 202b and the third pixel unit 202c are the same and equal to an area of a third color sub-pixel 205 in the second display region 233.

In some exemplary embodiments, the reduced area of the first color sub-pixel 203 in the first display region 232 is related to the distance between the pixel luminance center of the pixel unit 202 where the first color sub-pixel 203 is located and the center of the small hole 230, and is also related to a viewing angle and luminance of light filtered out by a filter unit 231 filled in the small hole 230. In some exemplary embodiments, light emitted by the first color sub-pixels 203 in the first display region 232 and the second display region 233 is emitted at a positive viewing angle, and the light filtered out by the filter unit 231 in the small hole 230 is emitted at a squint angle. Due to existence of microcavity effect, color coordinates of light at different viewing angles are different (that is, the colors are different), that is, a color coordinate of the light emitted by the first color sub-pixels 203 in the first display region 232 and the second display region 233 is different from a color coordinate of the light filtered out by the filter unit 231 in the small hole 230. Microcavity effect means that when a light emitting region of a display panel is located in a resonant cavity composed of a total reflection film and a semi-reflection film, and a length of the cavity have a same order of magnitude as the wavelength of light wave, light of a specific wavelength will be selected and strengthened, and narrowing will occur to the light spectrum. Since the luminance and color coordinates of the pixel unit 202 in the second display region 233 are known, the luminance and the color coordinate of the light filtered out by the filter unit 231 in the small hole 230 can be obtained by Lighttools software simulation. For example, the luminance of the light filtered out by the filter unit 231 in the small hole 230 is equivalent to 10% of the luminance of the light emitted by the first color sub-pixels 203 in the second display region 233, and the color coordinate of the light filtered out by the filter unit 231 in the small hole 230 is equivalent to the color coordinate of the light emitted by the first color sub-pixels 203 in the second display region 233 at a viewing angle between 40° and 50°. According to simulation results of the light filtered out by the filter unit 231 in the small hole 230, after the scale-up or scale-down is performed according to the distance between the pixel luminance center of the pixel unit 202 in the first display region 232 and the center of the small hole 230, a luminous intensity of the pixel unit 202 is reduced without changing the current flowing through the pixel unit 202. A white light color matching formula is shown as below:

$$\begin{bmatrix} L_R \\ L_G \\ L_B \end{bmatrix} = \begin{bmatrix} R_X & G_X & B_X \\ R_Y & G_Y & B_Y \\ R_Z & G_Z & B_Z \end{bmatrix}^{-1} \cdot \begin{bmatrix} X \\ Y \\ Z \end{bmatrix}$$

wherein $L_R$ is luminance of a red light sub-pixel in the target light, $L_G$ is luminance of a green light sub-pixel in the target light, $L_B$ is luminance of a blue light sub-pixel in the target light, X is a red primary color stimulating quantity, Y is a green primary color stimulating quantity, Z is a blue primary color stimulating quantity, $R_X$, $R_Y$ and $R_Z$ represent color coordinate coefficients of red light, $G_X$, $G_Y$ and $G_Z$ are color coordinate coefficients of green light, and $B_X$, $B_Y$ and $B_Z$ are color coordinate coefficients of blue light, wherein the target light may be white light.

Each set of sub-pixels of the pixel units 202 and the luminance color coordinates assigned to the small hole 230 are matched in color, and the scaled sizes of the first color sub-pixels 203 in the first display region 232 is obtained after multiple iterations and recursions, thereby effectively eliminating the problem of display color shift caused by the filter unit 231 in the small hole 230. In other words, the areas of the first color sub-pixels 203 in the first display region 232 are scaled down according to the distance between the pixel luminance center of the pixel unit 202 in the first display region 232 and the center of the small hole 230, to match the white light color coordinate of the pixel units 202 in the first display region 232, so that a displayed color is consistent with the white light color coordinate of the pixel unit 202 in the second display region 233.

In an exemplary embodiment, as shown in FIG. 1, the display substrate 1 further includes a touch structure layer 227, wherein the touch structure layer 227 is located between the encapsulation layer 209 and the color film structure layer 210. The touch structure layer 227 includes a first touch electrode layer 228 and a second touch electrode layer 229 that are stacked.

An embodiment of the present disclosure further provides a method for manufacturing a display substrate, which includes:

forming multiple pixel units on a baseplate, wherein a pixel unit includes multiple sub-pixels, the multiple sub-pixels includes first color sub-pixels, at least one sub-pixel includes a color film structure layer, the color film structure layer includes a black matrix defining a pixel opening and a color film unit covering the pixel opening;

wherein the display substrate includes a first display region and a second display region located at a periphery of the first display region, and a small hole, which is filled with a filter unit, is provided on the black matrix in the first display region, a material of the filter unit is the same as a material of the color film unit of the first color sub-pixel, and an area of the first color sub-pixel in the first display region is less than an area of the first color sub-pixel in the second display region.

An embodiment of the present disclosure further provides a display apparatus, which includes the display substrate according to any one of the exemplary embodiments of the present disclosure. The display apparatus may be any product or component with a display function, such as a mobile phone, a tablet computer, a television, a display, a laptop computer, a digital photo frame, a navigator, etc.

Although the implementations disclosed in the present disclosure are described as above, the described contents are only implementations which are used in order to facilitate understanding of the present disclosure, and are not intended to limit the present disclosure. Any skilled person in the art to which the present disclosure pertains can make any modifications and alterations in forms and details of implementation without departing from the spirit and scope of the present disclosure. However, the patent protection scope of the present disclosure should be subject to the scope defined by the appended claims.

The invention claimed is:

1. A display substrate comprising a baseplate and a plurality of pixel units arranged on the baseplate, wherein a pixel unit comprises a plurality of sub-pixels, at least one of the sub-pixels comprises a color film structure layer, the color film structure layer comprises a black matrix defining a pixel opening and a color film unit covering the pixel opening, the display substrate comprises a first display region and a second display region located at a periphery of the first display region, each of the first display region and the second display region comprises a first color sub-pixel, a second color sub-pixel and a third color sub-pixel, a small hole, which is filled with a filter unit, is provided on the black matrix in the first display region, a material of the filter unit is the same as a material of the color film unit of the first color sub-pixel, an area of the first color sub-pixel in the first display region is less than an area of the first color sub-pixel in the second display region, an area of the second color sub-pixel in the first display region is equal to an area of the second color sub-pixel in the second display region, and an area of the third color sub-pixel in the first display region is equal to an area of the third color sub-pixel in the second display region.

2. The display substrate according to claim 1, wherein a plurality of first display regions are provided and a first display region comprises at least one small hole.

3. The display substrate according to claim 1, wherein light filtered out by the filter unit is green light, and the first color sub-pixel is a green light sub-pixel.

4. The display substrate according to claim 3, wherein the area of the first color sub-pixel in the first display region is directly proportional to a distance between a pixel luminance center of a pixel unit where the first color sub-pixel is located and a center of the small hole, the pixel luminance center is a position which is located on a line connecting a pixel center of a red light sub-pixel and a pixel center of a green light sub-pixel and is at 30% of a distance from the pixel center of the green light sub-pixel.

5. The display substrate according to claim 3, wherein the second color sub-pixel is a blue light sub-pixel, the third color sub-pixel is a red light sub-pixel.

6. The display substrate according to claim 5, wherein two first color sub-pixels form a set of the first color sub-pixels, and in a plane parallel to the baseplate, sets of the first color sub-pixels are arranged in a plurality of columns, the second color sub-pixels are arranged in a plurality of columns, the third color sub-pixels are arranged in a plurality of columns, any three adjacent columns of sub-pixels comprise a column of sets of first color sub-pixels, a column of second color sub-pixels and a column of third color sub-pixels, the sets of the first color sub-pixels in the column of the sets of first color sub-pixels and the second color sub-pixels and the third color sub-pixels in the adjacent columns are arranged in a staggered manner, the two first color sub-pixels of the set of the first color sub-pixels are arranged at intervals along a direction of the column, and a first color sub-pixel and an adjacent second color sub-pixel and an adjacent third color sub-pixel in the column of the second color sub-pixels and the column of the third color sub-pixels which are adjacent to the column of the set of the first color sub-pixels form a pixel unit.

7. The display substrate according to claim 6, wherein in the plane parallel to the baseplate and in a direction perpendicular to the column, a width of the second color sub-pixel is greater than a width of the first color sub-pixel, and the width of the first color sub-pixel is greater than a width of the third color sub-pixel.

8. The display substrate according to claim 6, wherein the small hole is provided in the column of the third color sub-pixels, and is located between two adjacent third color sub-pixels and close to an end of one of the two third color sub-pixels, the first display region comprises a first pixel unit, a second pixel unit and a third pixel unit, wherein the first pixel unit is a pixel unit in which a first color sub-pixel relatively close to the small hole in a set of first color sub-pixels close to the small hole in a column of sets of first color sub-pixels adjacent to the small hole is located, the second pixel unit is a pixel unit in which a first color sub-pixel relatively away from the small hole in the set of the first color sub-pixels close to the small hole is located, and the third pixel unit is a pixel unit in which a second color sub-pixel close to the small hole in a column of second color sub-pixels adjacent to the small hole is located and the first color sub-pixel is close to the small hole; or the small hole is arranged in the column of the second color sub-pixels, and is located between two adjacent second color sub-pixels and close to an end of one of the two second color sub-pixels, the first display region comprises a first pixel unit, a second pixel unit and a third pixel unit, wherein the first pixel unit is a pixel unit in which a first color sub-pixel relatively close to the small hole in a set of first color sub-pixels close to the small hole in a column of sets of first color sub-pixels adjacent to the small hole is located, the second pixel unit is a pixel unit in which a first color sub-pixel relatively away from the small hole in the set of first color sub-pixels close to the small hole is located, and the third pixel unit is a pixel unit in which a third color sub-pixel close to the small hole in a column of third color sub-pixels adjacent to the small hole is located and the first color sub-pixel is close to the small hole.

9. The display substrate according to claim 8, wherein a distance between a pixel luminance center of the first pixel unit and a center of the small hole is set to a first distance, a distance between a pixel luminance center of the second pixel unit and the center of the small hole is set to a second distance, and a distance between a pixel luminance center of the third pixel unit and the center of the small hole is set to a third distance, the first distance is less than the third distance, and the third distance is less than the second distance.

10. The display substrate according to claim 5, wherein two first color sub-pixels form a set of first color sub-pixels, and in a plane parallel to the baseplate, sets of the first color sub-pixels are arranged in a plurality of rows, the second color sub-pixels are arranged in a plurality of rows, the third color sub-pixels are arranged in a plurality of rows, any three adjacent rows of sub-pixels comprise a row of sets of first color sub-pixels, a row of second color sub-pixels and a row of third color sub-pixels, the sets of first color sub-pixels in the row of the sets of the first color sub-pixels and the second color sub-pixels and the third color sub-pixels in the adjacent rows are arranged in a staggered manner, the two first color sub-pixels of the set of the first color sub-pixels are arranged at intervals along a direction of the row, and a first color sub-pixel and an adjacent second color sub-pixel and an adjacent third color sub-pixel in the row of the second color sub-pixels and the row of the third color sub-pixels which are adjacent to the row of the sets of the first color sub-pixels form a pixel unit.

11. The display substrate according to claim 10, wherein in the plane parallel to the baseplate and in a direction perpendicular to the row, a width of the second color sub-pixel is greater than a width of the first color sub-pixel, and the width of the first color sub-pixel is greater than a width of the third color sub-pixel.

12. The display substrate according to claim 10, wherein the small hole is arranged in the row of the third color sub-pixels, and is located between two adjacent third color sub-pixels and close to an end of one of the two third color sub-pixels, the first display region comprises a first pixel unit, a second pixel unit and a third pixel unit, wherein the first pixel unit is a pixel unit in which a first color sub-pixel relatively close to the small hole in a set of first color sub-pixels close to the small hole in a row of sets of first color sub-pixels adjacent to the small hole is located, the second pixel unit is a pixel unit in which a first color sub-pixel relatively away from the small hole in the set of the first color sub-pixels close to the small hole is located, and the third pixel unit is a pixel unit in which a second color sub-pixel close to the small hole in a row of second color sub-pixels adjacent to the small hole is located and the first color sub-pixel is close to the small hole; or the small hole is arranged in the row of the second color sub-pixels, and is located between two adjacent second color sub-pixels and close to an end of one of the two second color sub-pixels, the first display region comprises a first pixel unit, a second pixel unit and a third pixel unit, wherein the first pixel unit is a pixel unit in which a first color sub-pixel relatively close to the small hole in a set of first color sub-pixels close to the small hole in a row of sets of first color sub-pixels adjacent to the small hole is located, the second pixel unit is a pixel unit in which a first color sub-pixel relatively away from the small hole in the set of the first color sub-pixels close to the small hole is located, and the third pixel unit is a pixel unit in which a third color sub-pixel close to the small hole in a row of third color sub-pixels adjacent to the small hole is located and the first color sub-pixel is close to the small hole.

13. The display substrate according to claim 12, wherein a distance between a pixel luminance center of the first pixel unit and a center of the small hole is set to a first distance, a distance between a pixel luminance center of the second pixel unit and the center of the small hole is set to a second distance, and a distance between a pixel luminance center of the third pixel unit and the center of the small hole is set to a third distance, the first distance is less than the third distance, and the third distance is less than the second distance.

14. The display substrate according to claim 1, wherein the first color sub-pixel emits light at a positive view angle, and light filtered out by the filter unit is emitted at a squint view angle.

15. A display apparatus comprising the display substrate according to claim 1.

16. A method for manufacturing a display substrate, which comprises:
    forming a plurality of pixel units on a baseplate, wherein a pixel unit comprises a plurality of sub-pixels, at least one of the sub-pixels comprises a color film structure layer, the color film structure layer comprises a black matrix defining a pixel opening and a color film unit covering the pixel opening;
    wherein the display substrate comprises a first display region and a second display region located at a periphery of the first display region, each of the first display region and the second display region comprises a first color sub-pixel, a second color sub-pixel and a third color sub-pixel, a small hole, which is filled with a filter unit, is provided on the black matrix in the first display region, a material of the filter unit is the same as a material of the color film unit of the first color sub-pixel, an area of the first color sub-pixel in the first display region is less than an area of the first color sub-pixel in the second display region, an area of the second color sub-pixel in the first display region is equal to an area of the second color sub-pixel in the second display region, and an area of the third color sub-pixel in the first display region is equal to an area of the third color sub-pixel in the second display region.

* * * * *